United States Patent
Abe et al.

(10) Patent No.: US 9,425,767 B2
(45) Date of Patent: Aug. 23, 2016

(54) ACOUSTIC WAVE DEVICE AND SEALING BODY CONTAINED THEREIN

(71) Applicant: SKYWORKS PANASONIC FILTER SOLUTIONS JAPAN CO., LTD., Kadoma-Shi (JP)

(72) Inventors: Fuyuki Abe, Kyoto-Fu (JP); Hidenori Uematsu, Osaka-Fu (JP); Tomohiro Fujita, Osaka-Fu (JP); Kenichi Matsushima, Hyogo-Ken (JP); Ichiro Kameyama, Osaka-Fu (JP); Tetsuya Furihata, Osaka-Fu (JP)

(73) Assignee: SKYWORKS PANASONIC FILTER SOLUTIONS JAPAN CO., LTD., Kadoma-Shi (JP)

( * ) Notice: Subject to any disclaimer, the term of this patent is extended or adjusted under 35 U.S.C. 154(b) by 366 days.

(21) Appl. No.: 14/094,791

(22) Filed: Dec. 3, 2013

(65) Prior Publication Data
US 2014/0159544 A1    Jun. 12, 2014

(30) Foreign Application Priority Data
Dec. 6, 2012   (JP) .................................. 2012-267131

(51) Int. Cl.
*H03H 9/25*    (2006.01)
*H01L 41/053*  (2006.01)
*H03H 9/02*    (2006.01)
*H03H 9/10*    (2006.01)

(52) U.S. Cl.
CPC ....... *H03H 9/02834* (2013.01); *H03H 9/02929* (2013.01); *H03H 9/1092* (2013.01)

(58) Field of Classification Search
USPC ............................ 310/311–371; 333/193–197
See application file for complete search history.

(56) References Cited

U.S. PATENT DOCUMENTS

2009/0297770 A1* 12/2009 Yoshida ............. B81C 1/00269
                                                        428/138
2010/0038992 A1   2/2010 Moriya et al.
(Continued)

FOREIGN PATENT DOCUMENTS

JP     2001-185976        7/2001
JP     2003-101383        4/2003
(Continued)

OTHER PUBLICATIONS

"Tg—Glass Transition Temperature for Epoxies", Epoxy Technology Inc., 2012, <http://www.epotek.com/site/files/Techtips/pdfs/tip23.pdf>.

*Primary Examiner* — Thomas Dougherty
(74) *Attorney, Agent, or Firm* — Lando & Anastasi, LLP

(57) ABSTRACT

An acoustic wave device includes a piezoelectric substrate, comb-shaped electrodes, wires, a sealing body, terminal electrodes, and connection electrodes. The comb-shaped electrodes are disposed on the piezoelectric substrate and are connected to the wires. The sealing body is disposed on the piezoelectric substrate in such a manner that the comb-shaped electrodes are sealed between the piezoelectric substrate and the sealing body. The terminal electrodes are disposed on the sealing body. The connection electrodes penetrate the sealing body so as to electrically connect the wires and the terminal electrodes, respectively. A first linear expansion coefficient in a first temperature range below a first glass transition temperature of the sealing body is larger than a second linear expansion coefficient in a second temperature range above the first glass transition temperature.

20 Claims, 6 Drawing Sheets

(56) References Cited

U.S. PATENT DOCUMENTS

| | | |
|---|---|---|
| 2010/0225202 A1 | 9/2010 | Fukano et al. |
| 2011/0043078 A1 | 2/2011 | Tsuda |
| 2011/0084573 A1* | 4/2011 | Yamaji ............... H03H 9/1092 310/340 |
| 2012/0086309 A1* | 4/2012 | Yamaji ............... H03H 9/1092 310/313 B |
| 2014/0049927 A1* | 2/2014 | Kamakura ............ H05K 1/183 361/760 |
| 2015/0243875 A1* | 8/2015 | Hira ................... H01L 41/0533 310/313 B |
| 2015/0270473 A1* | 9/2015 | Uematsu ............. H03H 9/1092 310/313 R |

FOREIGN PATENT DOCUMENTS

| | | |
|---|---|---|
| JP | 2005-217177 | 8/2005 |
| JP | 2006-304145 | 11/2006 |
| JP | 2007-096519 | 4/2007 |
| JP | 2009-188844 | 8/2009 |
| JP | 2009-200996 | 9/2009 |
| JP | 2010-245704 | 10/2010 |
| JP | 2011-147098 | 7/2011 |
| WO | 2009/057699 | 5/2009 |

* cited by examiner

ACOUSTIC WAVE DEVICE AND SEALING BODY CONTAINED THEREIN

BACKGROUND

1. Technical Field

The technical field relates to an acoustic wave device used in various communication and high-frequency electronic devices, and also relates to a sealing body contained in the acoustic wave device.

2. Background Art

FIG. 10 is a schematic sectional view of conventional acoustic wave device 21. Acoustic wave device 21 includes piezoelectric substrate 22, comb-shaped electrodes 23, wires 24, cover 26, sealing body 27, terminal electrodes 28, and connection electrodes 29. Piezoelectric substrate 22 is formed of a single-crystal piezoelectric body. Comb-shaped electrodes 23 and wires 24 are disposed on piezoelectric substrate 22. Cover 26 is extended over comb-shaped electrodes 23 in such a manner as to create space 25 in which comb-shaped electrodes 23 can excite. Sealing body 27 is placed over cover 26 so as to seal space 25. Terminal electrodes 28 are disposed on sealing body 27. Connection electrodes 29 penetrate sealing body 27 so as to electrically connect wires 24 and terminal electrodes 28.

SUMMARY

Acoustic wave devices according to various exemplary embodiments each include a piezoelectric substrate, comb-shaped electrodes, wires, a sealing body, terminal electrodes, and connection electrodes. The comb-shaped electrodes are disposed on the piezoelectric substrate. The wires are connected to the comb-shaped electrodes. The sealing body is disposed on the piezoelectric substrate in such a manner that the comb-shaped electrodes are sealed between the piezoelectric substrate and the sealing body. The terminal electrodes are disposed on the sealing body. The connection electrodes penetrate the sealing body so as to electrically connect the wires and the terminal electrodes.

In a first acoustic wave device, a first linear expansion coefficient in a first temperature range below a first glass transition temperature of the sealing body is larger than a second linear expansion coefficient in a second temperature range above the first glass transition temperature.

In a second acoustic wave device, the sealing body has a plurality of glass transition temperatures in a temperature range not exceeding the curing temperature of the sealing body.

In a third acoustic wave device, the sealing body has a glass transition temperature, and the relative greatnesses of the linear expansion coefficients of the sealing body and of the piezoelectric substrate are reversed between lower and higher temperatures with respect to the glass transition temperature.

DESCRIPTION OF EMBODIMENTS

Figure 10:
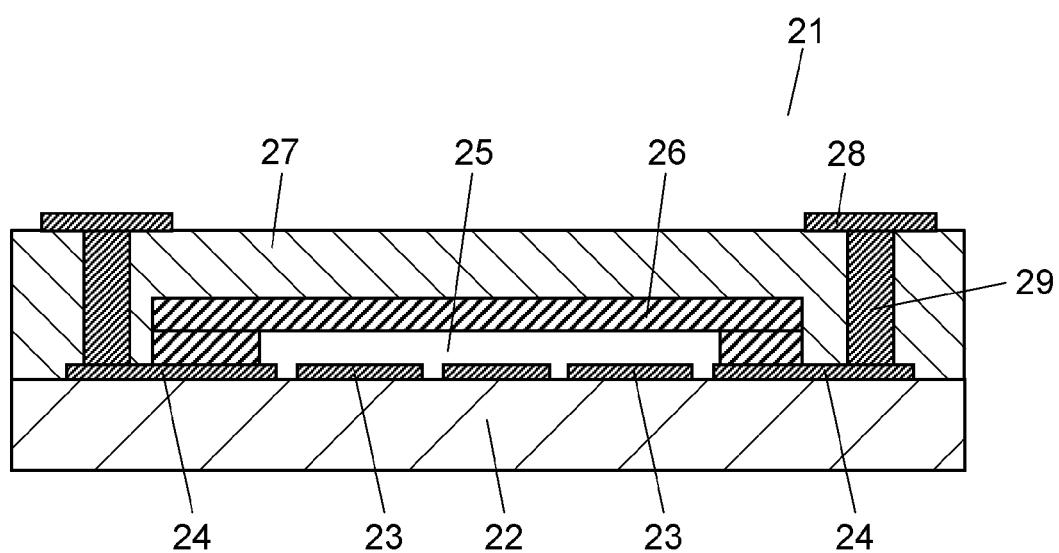
FIG. 10 is a schematic sectional view of a conventional acoustic wave device.

Conventional acoustic wave device 21 shown in FIG. 10 has reliability problems such as delamination and cracking after long-term use, which eventually may result in breakage.

Acoustic wave devices according to the exemplary embodiments, which have long-term reliability, will now be described with reference to the drawings.

First Exemplary Embodiment

Figure 1:
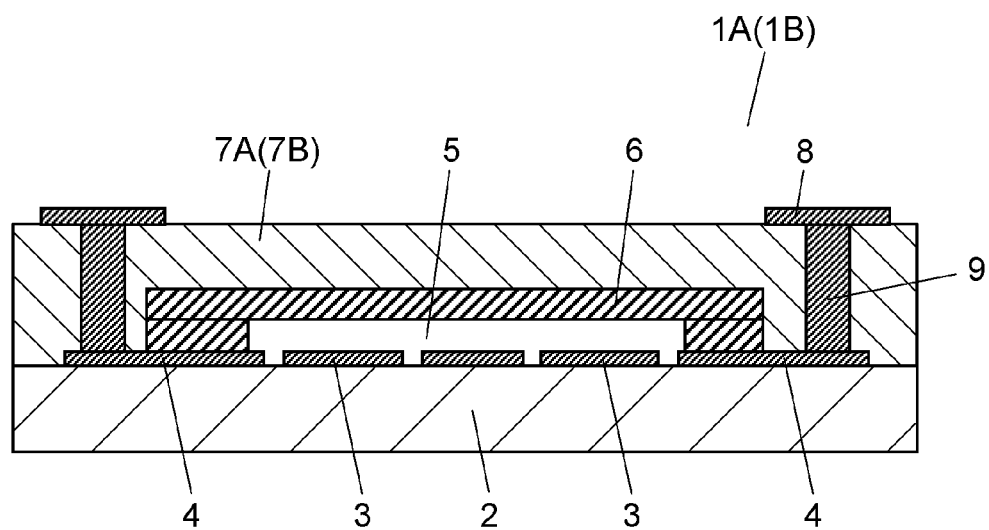
FIG. 1 is a schematic sectional view of an acoustic wave device according to first and second exemplary embodiments.

FIG. 1 is a schematic sectional view of acoustic wave device 1A according to a first exemplary embodiment. Acoustic wave device 1A includes piezoelectric substrate 2, comb-shaped electrodes 3, wires 4, sealing body 7A, terminal electrodes 8, and connection electrodes 9. Comb-shaped electrodes 3 and wires 4 are disposed on piezoelectric substrate 2 and are connected to each other. Cover 6 is extended over comb-shaped electrodes 3 in such a manner as to create space 5 in which comb-shaped electrodes 3 can excite. Sealing body 7A is placed on piezoelectric substrate 2 so that comb-shaped electrodes 3 are sealed between piezoelectric substrate 2 and sealing body 7A. In other words, sealing body 7A covers space 5 via cover 6. Terminal electrodes 8 are disposed on sealing body 7A. Connection electrodes 9 penetrate sealing body 7A so as to electrically connect wires 4 and terminal electrodes 8.

Acoustic wave device 1A is an extremely small electronic component with an area similar to that of piezoelectric substrate 2. Acoustic wave device 1A is called a wafer-level chip size package (WL-CSP) because comb-shaped electrodes 3 and space 5 are sealed and terminal electrodes 8 are formed before piezoelectric substrate 2 in a wafer state is divided into a plurality of pieces.

Each part of acoustic wave device 1A is described as follows. Piezoelectric substrate 2 is made of, for example, rotated Y-cut X Propagation single-crystal lithium tantalate and has a thickness of, for example, 100 to 350 μm. In the following description, the propagation direction of a surface acoustic wave on a surface is defined as the X direction; a direction perpendicular to the propagation direction is defined as the Y direction; and the thickness direction of piezoelectric substrate 2 is defined as the Z direction. When these definitions are used, piezoelectric substrate 2 has a linear expansion coefficient $\alpha X$ in the X direction and a linear expansion coefficient $\alpha Y$ in the Y direction. The coefficients $\alpha X$ and $\alpha Y$ are, for example, 16.2 ppm/°C., and 9.7 ppm/°C., respectively.

Comb-shaped electrodes 3 are made of aluminum-based metal. When subjected to a voltage, comb-shaped electrodes 3 excite to generate a surface acoustic wave on the surface of piezoelectric substrate 2. If needed, comb-shaped electrodes 3 may be coated with a protective layer made of a dielectric such as silicon oxide.

Wires 4, which are made of a conductor, are disposed on the surface of piezoelectric substrate 2 and are electrically connected to comb-shaped electrodes 3, respectively.

Space 5 is a sealed cavity formed above comb-shaped electrodes 3 so that the surface acoustic wave is excited on the surface of piezoelectric substrate 2. Space 5 is either filled with air or an inert gas, or vacuum-sealed.

Cover 6 is made of polyimide-based resin and is placed on piezoelectric substrate 2 in such a manner as to cover comb-shaped electrodes 3 with space 5 therebetween.

Sealing body 7A, which is made of an insulator, covers space 5 via cover 6. Sealing body 7A is formed by thermosetting a thermosetting resin containing an inorganic filler.

Terminal electrodes 8, which are made of a conductor, function as input-output terminals or ground terminals of acoustic wave device 1A. Terminal electrodes 8 are formed on the top surface of sealing body 7A by, for example, photolithography.

Connection electrodes 9, which are made of a conductor, penetrate sealing body 7A so as to connect wires 4 and terminal electrodes 8. Connection electrodes 9 are formed by, for example, electrolytic copper plating.

In the above-described configuration, sealing body 7A has a glass transition temperature (a first glass transition temperature), and a linear expansion coefficient of sealing body 7A in a temperature range above this glass transition temperature is smaller than a linear expansion coefficient of sealing body 7A in a temperature range below this glass transition temperature. In other words, a first linear expansion coefficient of sealing body 7A in a first temperature range below a first glass transition temperature of sealing body 7A is larger than a second linear expansion coefficient of sealing body 7A in a second temperature range above the first glass transition temperature.

With this configuration, an increase or decrease in the stress applied to sealing body 7A, which is caused by temperature changes, can be reversed at the glass transition temperature (the first glass transition temperature). As a result, the stress applied to sealing body 7A can be small in a wide temperature range, making sealing body 7A unlikely to break after long-term use, thereby achieving reliable acoustic wave device 1A.

Figure 2:
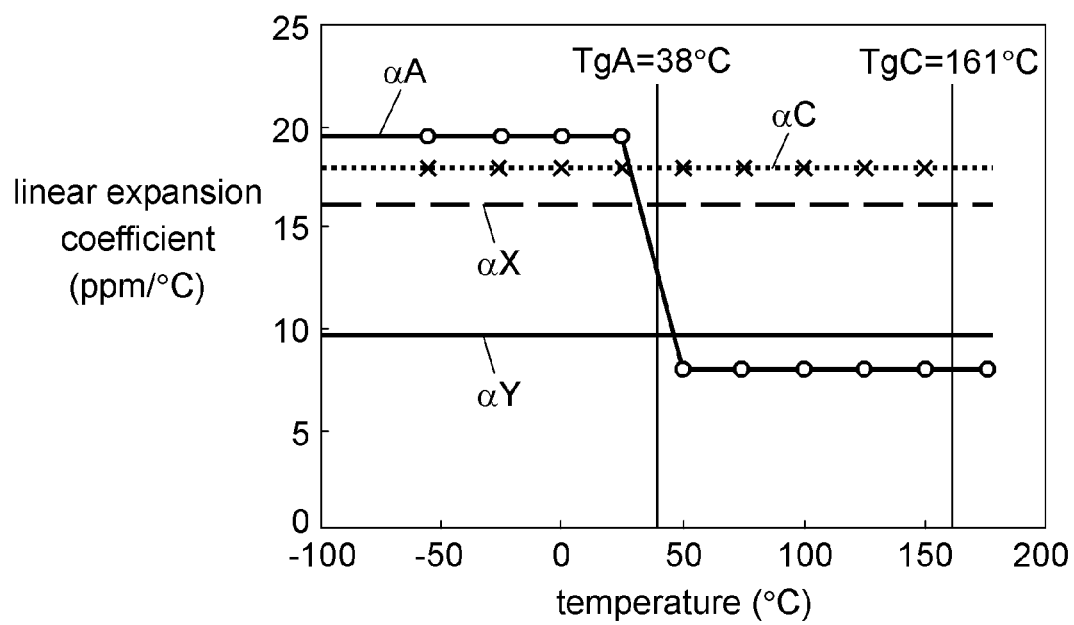
FIGS. 2 to 9 are characteristic diagrams of a sealing body contained in the acoustic wave device shown in FIG. 1.
Figure 3:
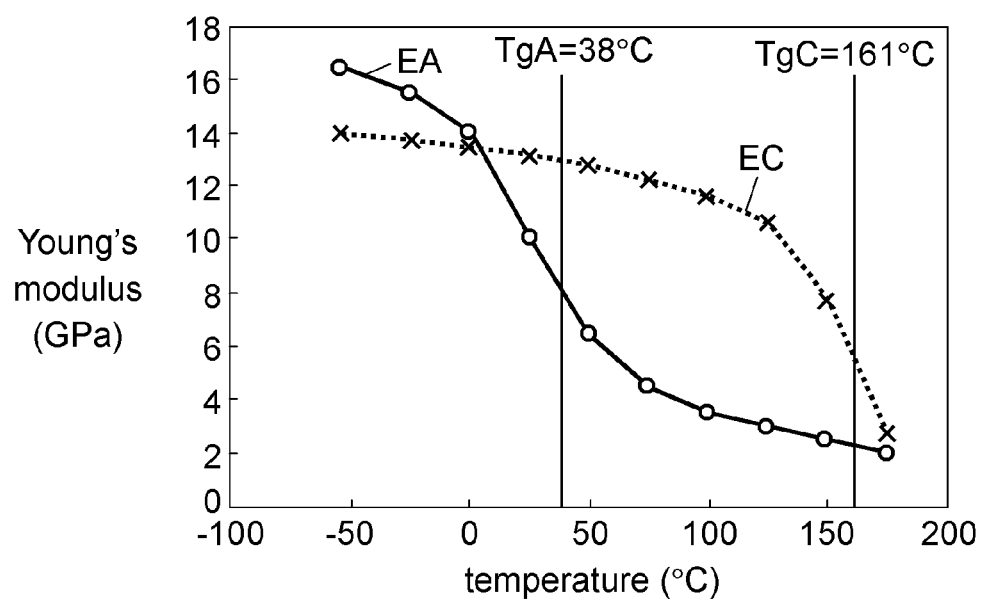
Figure 4:
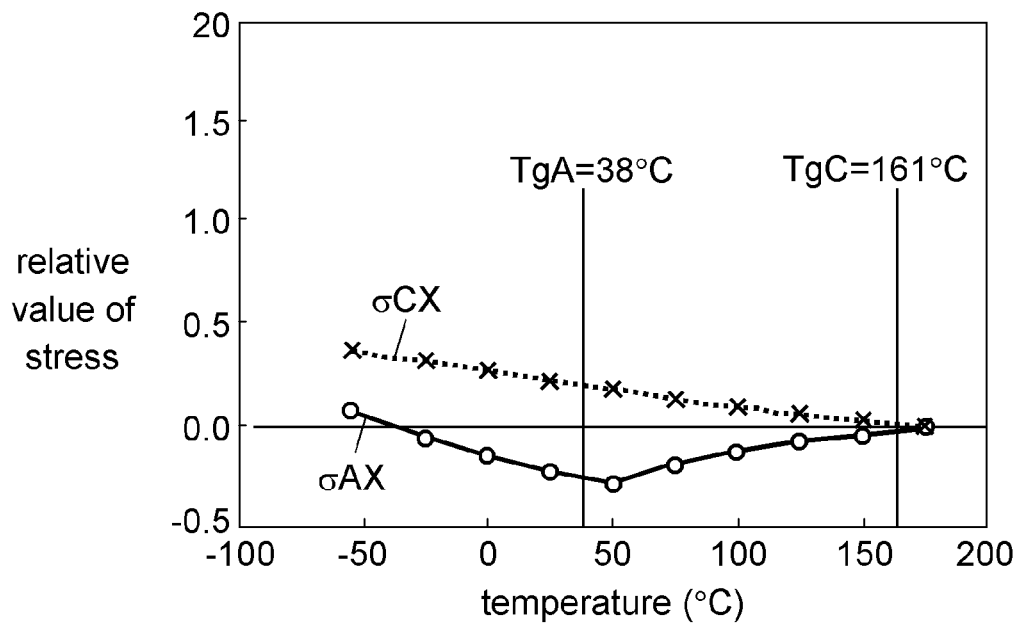
Figure 5:
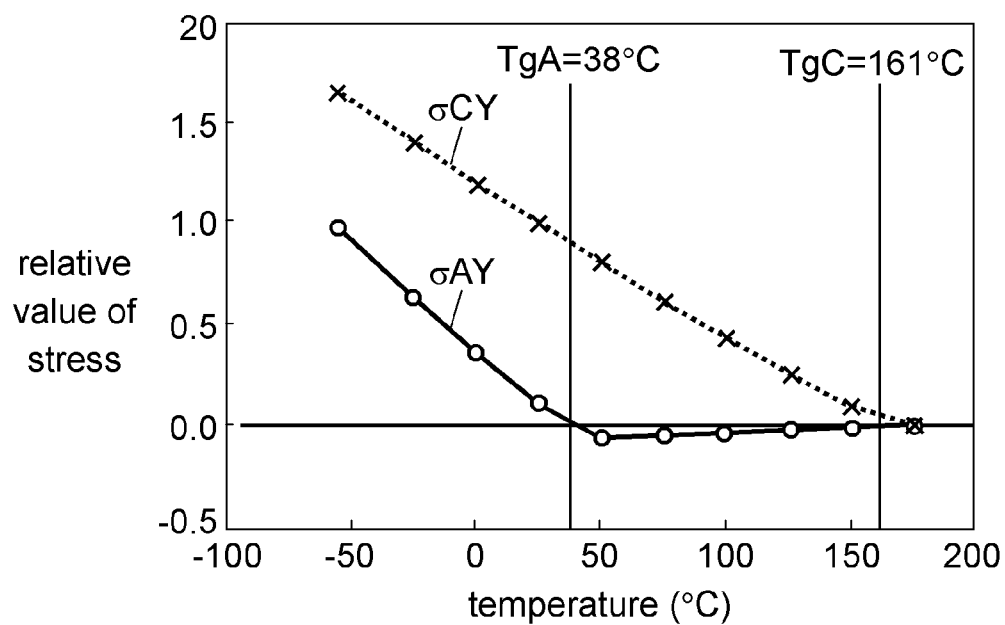

Sealing body 7A has properties shown in FIGS. 2 to 5. FIGS. 2 and 3 show temperature changes in the linear expansion coefficient and the Young's modulus, respectively, of sealing body 7A. FIGS. 4 and 5 show relative values of the stress applied to sealing body 7A by piezoelectric substrate 2 in the X direction and the Y direction, respectively.

In FIG. 2, sealing body 7A has a linear expansion coefficient $\alpha A$ shown in a solid line, and sealing body 27 of conventional acoustic wave device 21, which is shown as a comparative example, has a linear expansion coefficient $\alpha C$ shown in the dotted line. Sealing body 7A has a glass transition temperature TgA of 38° C. FIG. 2 also shows the linear expansion coefficients $\alpha X$ and $\alpha Y$ in the X and Y directions, respectively, of piezoelectric substrates 2 and 22 both of which are made of single-crystal lithium tantalate. The linear expansion coefficient $\alpha X$ is 16.2 ppm/° C. as shown in the broken line, and the linear expansion coefficient $\alpha Y$ is 9.7 ppm/° C. as shown in the other solid line.

Since having a large linear expansion coefficient $\alpha X$, piezoelectric substrate 2 greatly changes in dimension in the X direction with temperature changes. This indicates that the temperature change affects electrical characteristics of acoustic wave devices 1A and 21.

Sealing body 27 of conventional acoustic wave device 21 has a glass transition temperature TgC of 161° C., which is at the same level as those of common thermosetting resins. The linear expansion coefficient $\alpha C$ of sealing body 27 in a temperature range not higher than the glass transition temperature TgC is set to a value close to the linear expansion coefficient $\alpha X$ in the X direction of piezoelectric substrate 22. As a result, sealing body 27 changes in dimension as piezoelectric substrate 22 changes in dimension in the X direction, so that the stress applied in the X direction to piezoelectric substrate 22 is small. The linear expansion coefficient $\alpha C$ of sealing body 27 has a temperature dependence in a temperature range above the glass transition temperature TgC. This temperature range, however, is outside the operating temperature range of acoustic wave device 21, and in addition, the resin component of sealing body 27 is softened in this temperature range. As a result, the reliability of acoustic wave device 21 is not greatly affected.

Sealing body 7A, on the other hand, has a linear expansion coefficient $\alpha A$ of about 19.5 ppm/° C. larger than the linear expansion coefficients $\alpha X$ and $\alpha Y$ of piezoelectric substrate 2 in the first temperature range below the glass transition temperature TgA. Sealing body 7A also has a linear expansion coefficient $\alpha A$ of 8 ppm/° C. lower than the linear expansion coefficients $\alpha X$ and $\alpha Y$ of piezoelectric substrate 2 in the second temperature range above the glass transition temperature TgA.

Next, the temperature changes in the Young's modulus of sealing body 7A is described with reference to FIG. 3. In FIG. 3, sealing body 7A has a Young's modulus EA shown in the solid line, and sealing body 27 of conventional acoustic wave device 21 has a Young's modulus EC shown in the dotted line. Piezoelectric substrates 2 and 22 made of single-crystal lithium tantalate have a Young's modulus of about 273 GPa.

The Young's modulus EC of sealing body 27 gradually increases as the temperature of sealing body 27 decreases from the glass transition temperature TgC. For example, the Young's modulus EC is 10 GPa or more at 125° C. or less and approaches 14 GPa as the temperature decreases toward −55° C. The Young's modulus EA of sealing body 7A, on the other hand, is comparatively small at temperatures above the glass transition temperature TgA and is comparatively large at temperatures below the glass transition temperature TgA. For example, the Young's modulus EA is 5 GPa or less at 75° C. or greater, and is 14 GPa or more at 0° C. or less.

The above-described properties of the linear expansion coefficient $\alpha A$ and of the Young's modulus EA are determined by the materials of the thermosetting resin and the inorganic filler, and the compounding ratio thereof. The glass transition temperature TgA is greatly affected by properties of the thermosetting resin. More specifically, using a thermosetting resin having a low glass transition temperature allows the glass transition temperature TgA of sealing body 7A to be within the operating temperature range of acoustic wave device 1A.

Furthermore, using a large ratio of the inorganic filler with respect to the thermosetting resin allows the linear expansion coefficient of sealing body 7A to be smaller in the temperature range above the glass transition temperature TgA than in the temperature range below the glass transition temperature TgA. In general, when epoxy resin is used as the thermosetting resin, the linear expansion coefficient of sealing body 7A is large in the temperature range above the glass transition temperature. If, however, the ratio of the inorganic filler with respect to the thermosetting resin is made large, the linear expansion coefficient of the inorganic filler might be dominant in the temperature range above the glass transition temperature. This is considered to be the reason why sealing body 7A has the temperature properties of the linear expansion coefficient shown in FIG. 2. Note that in sealing body 27, the amount of the inorganic filler per 100 parts by weight of the thermosetting resin (epoxy resin) is 40 parts by weight, whereas in sealing body 7A, the amount of the inorganic filler per 100 parts by weight of the thermosetting resin (an epoxy resin different from the kind used in sealing body 27) is, for example, 80 parts by weight.

Next, the stress in the X direction applied to sealing body 7A by piezoelectric substrate 2 is described with reference to FIG. 4. The relative values of the stress shown in FIG. 4 are obtained by simulated calculation using the linear expansion coefficient $\alpha A$ and the Young's modulus EA. $\sigma AX$ indicates relative values of the stress in the X direction applied to sealing body 7A by piezoelectric substrate 2 due to temperature change. $\sigma CX$ indicates relative values of the stress in the X direction applied to sealing body 27 of conventional acoustic wave device 21 by piezoelectric substrate 22 due to temperature change.

When the relative value σAX is positive, sealing body 7A is under a compressive stress in the X direction applied by piezoelectric substrate 2 and is applying a tensile stress to piezoelectric substrate 2. Similarly, when the relative value σCX is positive, sealing body 27 is under a compressive stress in the X direction applied by piezoelectric substrate 22 and is applying a tensile stress to piezoelectric substrate 22. In contrast, when the relative value σAX is negative, sealing body 7A is under a tensile stress applied by piezoelectric substrate 2 and is applying a compressive stress to piezoelectric substrate 2 because sealing body 7A contracts less than piezoelectric substrate 2 in the X direction. Similarly, when the relative value σCX is negative, sealing body 27 is under a tensile stress applied by piezoelectric substrate 22 and is applying a compressive stress to piezoelectric substrate 22 because sealing body 27 contracts less than piezoelectric substrate 22 in the X direction.

As shown in FIG. 4, the relative value σCX is 0 at the curing temperature (180° C.) of sealing body 27 and gradually increases with decreasing temperature. For example, the relative value σCX is approximately 0.4 at −55° C. On the other hand, the relative value σAX is 0 at the curing temperature (180° C.) of sealing body 7A and decreases with decreasing temperature until reaching a minimum at around 50° C. The relative value σAX then increases at temperatures below 50° C. and reaches approximately 0.1 at −55° C. Thus, the increase and the decrease in the stress applied to sealing body 7A are reversed to each other at around 50° C., making the stress small especially in a low temperature range of −55 to 0° C. Therefore, breakage of sealing body 7A is suppressed, thereby achieving reliable acoustic wave device 1A.

Since the X direction is the propagation direction of a surface acoustic wave, the stress in the X direction affects electrical characteristics of acoustic wave device 1A; however, reducing the stress between piezoelectric substrate 2 and sealing body 7A can reduce the influence to electrical characteristics of acoustic wave device 1A.

Next, the stress in the Y direction applied to sealing body 7A by piezoelectric substrate 2 is described with reference to FIG. 5. The relative values of the stress shown in FIG. 5 are obtained by simulated calculation using the linear expansion coefficient αA and the Young's modulus EA. σAY indicated relative values of the stress in the Y direction applied to sealing body 7A by piezoelectric substrate 2 due to temperature change. σCY indicated relative values of the stress in the Y direction applied to sealing body 27 of conventional acoustic wave device 21 by piezoelectric substrate 22 due to temperature change.

When the relative value σAY is positive, sealing body 7A is under a compressive stress in the Y direction applied by piezoelectric substrate 2 because sealing body 7A contracts more than piezoelectric substrate 2 in the Y direction. Similarly, when the relative value σCY is positive, sealing body 27 is under a compressive stress in the Y direction applied by piezoelectric substrate 22 because sealing body 27 contracts more than piezoelectric substrate 22 in the Y direction. In contrast, when the relative value σAY is negative, sealing body 7A is under a tensile stress applied by piezoelectric substrate 2 because sealing body 7A contracts less than piezoelectric substrate 2 in the Y direction. Similarly, when the relative value σCY is negative, sealing body 27 is under a tensile stress applied by piezoelectric substrate 22 because sealing body 27 contracts less than piezoelectric substrate 22 in the Y direction.

The relative value σCY is 0 at the curing temperature (180° C.) of sealing body 27 and gradually increases with decreasing temperature. For example, the relative value σCY is approximately 1.65 at −55° C. Thus, when the relative value σCY is positive, the stress applied to sealing body 27 by piezoelectric substrate 2 is a compressive stress, which increases with decreasing temperature. This may cause cracks in sealing body 27, particularly in a low-temperature range in which the resin contained in sealing body 27 becomes rigid and fragile.

On the other hand, the relative value σAY is 0 at the curing temperature (180° C.) of sealing body 7A and slightly decreases with decreasing temperature until reaching a minimum at around 50° C. The relative value σAY then increases at temperatures below 50° C., and reaches approximately 1.0 at −55° C. Thus, sealing body 7A is under a vanishingly small stress in the Y direction in a high temperature range of 50 to 180° C. and is under a small compressive stress in the Y direction in a low temperature range of −55 to 25° C. This suppresses damage in sealing body 7A, thereby achieving reliable acoustic wave device 1A.

As described above, sealing body 7A has a greater linear expansion coefficient in the temperature range below the glass transition temperature TgA than in the temperature range above the glass transition temperature TgA. As a result, the stress applied to sealing body 7A is small in a wide temperature range, making sealing body 7A unlikely to break during long-term use, thereby achieving reliable acoustic wave device 1A. It is preferable that the glass transition temperature of sealing body 7A is 50° C. or less. In this case, the stress applied to sealing body 7A is small in a low-temperature range, thereby achieving reliable acoustic wave device 1A.

In the Y direction in which piezoelectric substrate 2 has a smaller linear expansion coefficient than in the X direction of the planar direction, sealing body 7A is under a large compressive stress particularly at low temperatures. For this reason, it is preferable that the linear expansion coefficient of sealing body 7A in the temperature range below the glass transition temperature TgA be larger than the minimum value of the linear expansion coefficients of piezoelectric substrate 2 in the planar direction. With this configuration, the stress applied to sealing body 7A is a compressive stress at temperatures below the glass transition temperature TgA, thereby making sealing body 7A less likely to be damaged.

It is also preferable that the linear expansion coefficient of sealing body 7A at temperatures above the glass transition temperature TgA be smaller than the maximum value of the linear expansion coefficients of piezoelectric substrate 2 in the planar direction. With this configuration, the stress applied to sealing body 7A is small in the high-temperature range above the glass transition temperature TgA, thereby suppressing the damage in sealing body 7A.

In sealing body 7A, the relative greatnesses of the linear expansion coefficients of piezoelectric substrate 2 and the linear expansion coefficient of the sealing body 7A are reversed between the lower and higher temperatures with respect to the glass transition temperature TgA. As a result, the stress applied to sealing body 7A can be reversed at the glass transition temperature TgA. Thus, the stress applied to sealing body 7A is small, thereby achieving reliable acoustic wave device 1A. This effect is particularly remarkable in the temperature ranges including the glass transition temperature TgA.

Second Exemplary Embodiment

Figure 6:
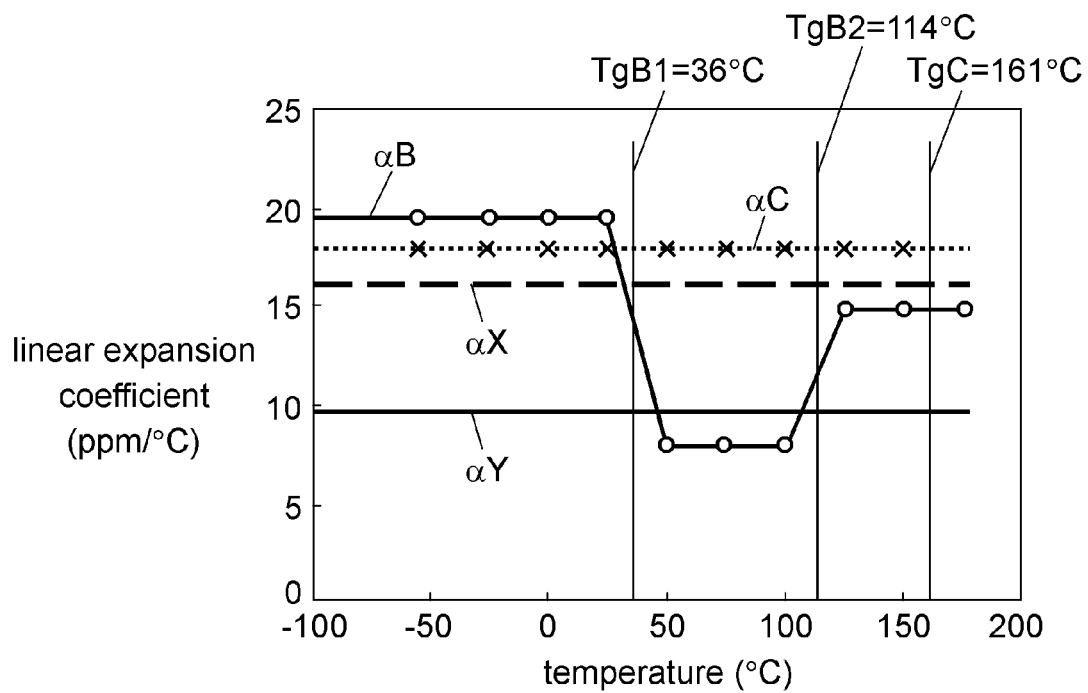
Figure 7:
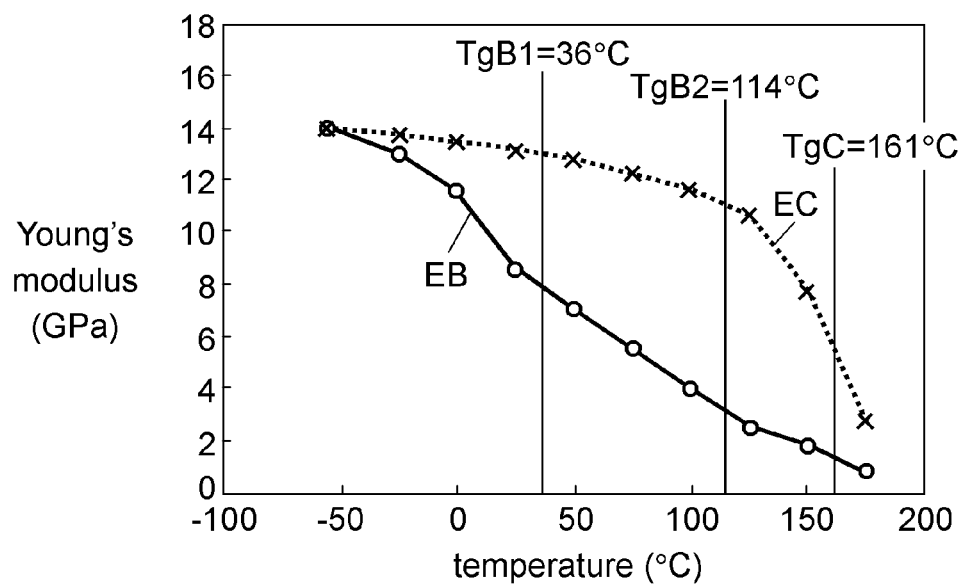
Figure 8:
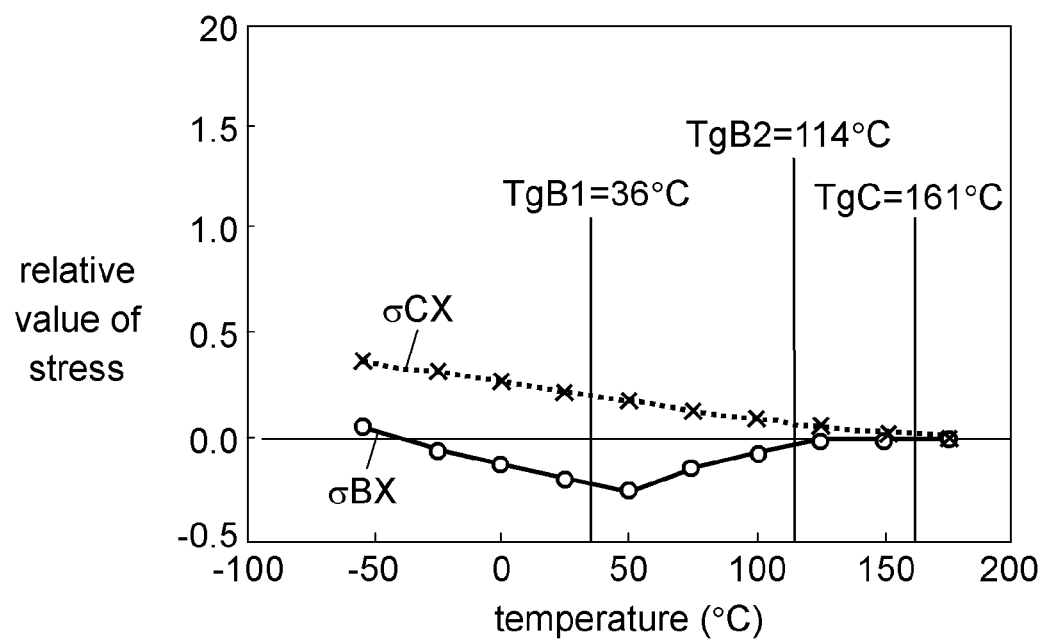
Figure 9:
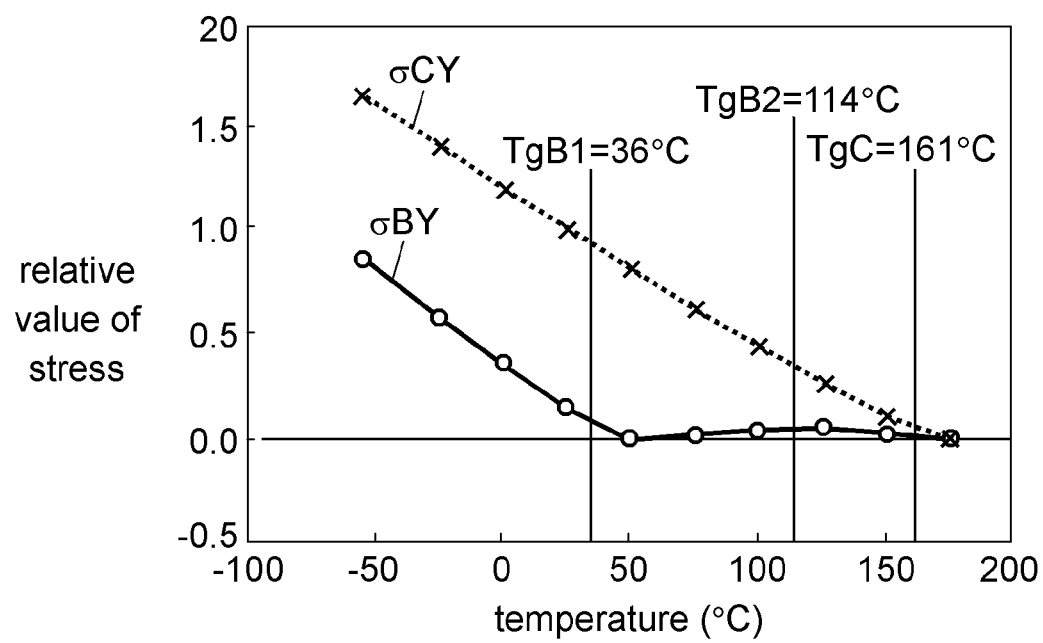

The following is description of acoustic wave device 1B according to a second exemplary embodiment. Acoustic wave device 1B has the same configuration as acoustic wave device 1A shown in FIG. 1 except for including sealing body 7B instead of sealing body 7A. Sealing body 7B has properties shown in FIGS. 6 to 9. FIGS. 6 and 7 show temperature changes in the linear expansion coefficient and the Young's modulus, respectively, of sealing body 7B. FIGS. 8 and 9 show relative values of the stress applied to sealing body 7B by piezoelectric substrate 2 in the X direction and the Y direction, respectively.

In FIG. 6, sealing body 7B has a linear expansion coefficient αB shown in a solid line. Sealing body 7B also has a first glass transition temperature TgB1 of, for example, 36° C., and a second glass transition temperature TgB2 of, for example, 114° C. FIG. 6 also shows the values of the following items, which are identical to those in the first exemplary embodiment: the linear expansion coefficient αC and the glass transition temperature TgC of sealing body 27 of conventional acoustic wave device 21; and the linear expansion coefficients αX and αY in the X and Y directions, respectively, of piezoelectric substrates 2 and 22.

In a temperature range below the glass transition temperature TgB1, the linear expansion coefficient αB of sealing body 7B is approximately 19.5 ppm/° C., which is larger than the linear expansion coefficients αX and αY of piezoelectric substrate 2. In a temperature range between the glass transition temperatures TgB1 and TgB2, the linear expansion coefficient αB is approximately 8 ppm/° C., which is smaller than the linear expansion coefficients αX and αY of piezoelectric substrate 2. In a temperature range above the glass transition temperature TgB2, the linear expansion coefficient αB is approximately 15 ppm/° C., which is larger than the linear expansion coefficient αY of piezoelectric substrate 2.

Next, the temperature changes in the Young's modulus of sealing body 7B is described with reference to FIG. 7. In FIG. 7, sealing body 7B of acoustic wave device 1B has a Young's modulus EB shown in the solid line, and sealing body 27 of conventional acoustic wave device 21 has the same Young's modulus EC as in FIG. 3 in the first exemplary embodiment.

The Young's modulus EB of sealing body 7B is comparatively small at temperatures above the glass transition temperature TgB1, and is comparatively large at temperatures below the glass transition temperature TgB1. More specifically, the Young's modulus EB is 3 GPa or less at 125° C. or more, and is 11 GPa or more at 0° C. or less.

The above-described properties of the linear expansion coefficient αB and of the Young's modulus EB are determined by the materials of the thermosetting resin and the inorganic filler, and the compounding ratio thereof. Sealing body 7B contains two kinds of epoxy resin having different glass transition temperatures from each other. The linear expansion coefficient is larger in the temperature range below the glass transition temperature TgB1 than in the temperature range between the glass transition temperatures TgB1 and TgB2. The reason for this is considered that the epoxy resin having the lower glass transition temperature and the inorganic filler act in the same manner as in the first exemplary embodiment. The linear expansion coefficient is larger in the temperature range above the glass transition temperature TgB2 than in the temperature range between the glass transition temperatures TgB1 and TgB2. The reason for this is considered that in the temperature range above the glass transition temperature TgB2, the linear expansion coefficient of the epoxy resin having the higher glass transition temperature becomes dominant.

Next, the stress in the X direction applied to sealing body 7B by piezoelectric substrate 2 is described with reference to FIG. 8. The relative values of the stress shown in FIG. 8 are obtained by simulated calculation using the linear expansion coefficient αB and the Young's modulus EB. σBX indicates relative values of the stress in the X direction applied to sealing body 7B by piezoelectric substrate 2 due to temperature changes. The relative values σCX are the same as that shown in FIG. 4 in the first exemplary embodiment.

When the relative value σBX is positive, sealing body 7B is under a compressive stress in the X direction applied by piezoelectric substrate 2 and is applying a tensile stress to piezoelectric substrate 2. In contrast, when the relative value σBX is negative, sealing body 7B is under a tensile stress applied by piezoelectric substrate 2 and is applying a compressive stress to piezoelectric substrate 2 because sealing body 7B contracts less than piezoelectric substrate 2 in the X direction. The cases when the relative value σCX is positive and negative are identical to those in the first exemplary embodiment, and hence the description thereof is omitted.

The relative value σBX is 0 at the curing temperature (180° C.) of sealing body 7B and gradually decreases with decreasing temperature until reaching a minimum at around 50° C. The relative value σBX then increases at lower temperatures below 50° C. and reaches approximately 0.05 at −55° C. Thus, the increase and decrease in the stress applied to sealing body 7B are reversed to each other at approximately 50° C. and the stress is consequently reduced. This makes sealing body 7B unlikely to break, thereby achieving reliable acoustic wave device 1B.

Next, the stress in the Y direction applied to sealing body 7B by piezoelectric substrate 2 is described with reference to FIG. 9. The relative values of the stress shown in FIG. 9 are obtained by simulated calculation using the linear expansion coefficient αB and the Young's modulus EB. σBY indicates relative values of the stress in the Y direction applied to sealing body 7B by piezoelectric substrate 2 due to temperature change. The relative value σCY is the same as that shown in FIG. 5 in the first exemplary embodiment.

When the relative value σBY is positive, sealing body 7B is under a compressive stress in the Y direction applied by piezoelectric substrate 2 because sealing body 7B contracts more than piezoelectric substrate 2 in the Y direction. In contrast, when the relative value σBY is negative, sealing body 7B is under a tensile stress applied by piezoelectric substrate 2 because sealing body 7B contracts less than piezoelectric substrate 2 in the Y direction. The cases when the relative value σCY is positive and negative are identical to those in the first exemplary embodiment, and hence the description thereof is omitted.

The relative value σBY is 0 at the curing temperature (180° C.) of sealing body 7B and slightly increases with decreasing temperature. The relative value σBY then begins to decrease at approximately 125° C. and then again begins to increase at around 50° C. Thus, sealing body 7B is under a vanishingly small stress in the Y direction in a temperature range of 50 to 125° C., so that the compressive stress can be low in the Y direction in a low temperature range of −55 to 25° C.

Thus, the stress applied to sealing body 7B is small in the Y direction, the damage of sealing body 7B is suppressed, thereby achieving reliable acoustic wave device 1B.

As described above, in acoustic wave device 1B, sealing body 7B has the first glass transition temperature TgB1 and the second glass transition temperature TgB2 higher than the first glass transition temperature TgB1. Assume that the temperature range below the first glass transition temperature TgB1 is a first temperature range, the temperature range between the first and second glass transition temperatures TgB1 and TgB2 is a second temperature range, and the temperature range above the second glass transition temperature TgB2 is a third temperature range. Then a first linear expansion coefficient of sealing body 7B in the first temperature range is larger than a second linear expansion coefficient of sealing body 7B in the second temperature range. Furthermore, a third linear expansion coefficient of sealing body 7B in the third temperature range is larger than the second linear expansion coefficient.

With this configuration, the linear expansion coefficient of sealing body 7B in the third temperature range can be brought close to the maximum value of the linear expansion coefficients of piezoelectric substrate 2 in the planar direction. Furthermore, the linear expansion coefficient of sealing body 7B in the second temperature range can be brought close to the minimum value of the linear expansion coefficients of piezoelectric substrate 2 in the planar direction. As a result, the stress applied to sealing body 7B is reduced in accordance with the thermal expansion behavior of piezoelectric substrate 2 having different linear expansion coefficients in the planar direction, thereby achieving reliable acoustic wave device 1B.

The above-described sealing bodies are effective not only in acoustic wave devices but also in electronic devices formed on substrates.

The third linear expansion coefficient of sealing body 7B can be made larger than the minimum value of the linear expansion coefficients of piezoelectric substrate 2 in the planar direction, so that the relative greatnesses of the linear expansion coefficients of sealing body 7B and of piezoelectric substrate 2 can be reversed between lower and higher temperatures with respect to the second glass transition temperature of sealing body 7B. As a result, the stress applied to sealing body 7B is small in the temperature range including the second glass transition temperature of sealing body 7B, thereby achieving reliable acoustic wave device 1B.

In sealing body 7B, the linear expansion coefficient of sealing body 7B changes at the glass transition temperatures, allowing the stress applied to sealing body 7B to be small. It is preferable that the plurality of glass transition temperatures be in the temperature range not exceeding the curing temperature of sealing body 7B. With this configuration, the stress applied to sealing body 7B is small in a wide temperature range, and hence, acoustic wave device 1B is reliable in a wide temperature range.

In sealing body 7B, the relative greatnesses of the linear expansion coefficients of piezoelectric substrate 2 and of sealing body 7B are reversed between the lower and higher temperatures with respect to the glass transition temperature. As a result, the stress applied to sealing body 7B is reversed and is consequently reduced, thereby achieving reliable acoustic wave device 1B. This effect is particularly remarkable in the temperature range including the glass transition temperature.

Sealing body 7B has a plurality of glass transition temperatures with respect to which the relative greatnesses of the linear expansion coefficients of piezoelectric substrate 2 and of sealing body 7B are reversed between the lower and higher temperatures. With this configuration, the stress applied to sealing body 7B is small in a wide temperature range, making acoustic wave device 1B reliable.

As described above, acoustic wave devices 1A and 1B according to the first and second exemplary embodiments are highly reliable and are therefore useful in high-frequency filters, splitters, duplexers, etc, which are mainly used in mobile communication devices.

What is claimed is:

1. An acoustic wave device comprising:
a piezoelectric substrate;
comb-shaped electrodes disposed on the piezoelectric substrate to generate a surface acoustic wave on a surface of the piezoelectric substrate;
a sealing body disposed on the piezoelectric substrate and sealing the comb-shaped electrodes between the piezoelectric substrate and the sealing body, the sealing body having a first linear expansion coefficient in a first temperature range below a first glass transition temperature of the sealing body, the first linear expansion coefficient being larger than a second linear expansion coefficient of the sealing body in a second temperature range above the first glass transition temperature.

2. The acoustic wave device of claim 1 wherein the first linear expansion coefficient is larger than a linear expansion coefficient of the piezoelectric substrate in a direction parallel to a plane defined by the surface of the piezoelectric substrate and perpendicular to a propagation direction of the surface acoustic wave.

3. The acoustic wave device of claim 1 wherein the second linear expansion coefficient is smaller than a linear expansion coefficient of the piezoelectric substrate in a propagation direction of the surface acoustic wave.

4. The acoustic wave device of claim 1 wherein the sealing body has a second glass transition temperature higher than the first glass transition temperature, the second temperature range is between the first glass transition temperature and the second glass transition temperature, and a third linear expansion coefficient of the sealing body in a third temperature range above the second glass transition temperature is larger than the second linear expansion coefficient.

5. The acoustic wave device of claim 4 wherein the third linear expansion coefficient is larger than a linear expansion coefficient of the piezoelectric substrate in a direction parallel to a plane defined by the surface of the piezoelectric substrate and perpendicular to a propagation direction of the surface acoustic wave.

6. The acoustic wave device of claim 4 wherein the first glass transition temperature and the second glass transition temperature are lower than a curing temperature of the sealing body.

7. An acoustic wave device comprising:
a piezoelectric substrate;
comb-shaped electrodes disposed on the piezoelectric substrate; and
a sealing body disposed on the piezoelectric substrate and sealing the comb-shaped electrodes between the piezoelectric substrate and the sealing body, the sealing body having a plurality of glass transition temperatures in a temperature range below a curing temperature of the sealing body.

8. An acoustic wave device comprising:
a piezoelectric substrate;
comb-shaped electrodes disposed on the piezoelectric substrate to generate a surface acoustic wave on a surface of the piezoelectric substrate; and
a sealing body disposed on the piezoelectric substrate and sealing the comb-shaped electrodes between the piezoelectric substrate and the sealing body, the sealing body having a glass transition temperature, a linear expansion coefficient of the sealing body being greater than a linear expansion coefficient of the piezoelectric substrate below the glass transition temperature and being less than the linear expansion coefficient of the piezoelectric substrate above the glass transition temperature.

9. The acoustic wave device of claim 8 wherein the sealing body has a plurality of glass transition temperatures.

10. A sealing body for sealing an electronic device mounted on a substrate, the sealing body having a first linear expansion coefficient in a first temperature range below a first glass transition temperature of the sealing body and a second linear expansion coefficient in a second temperature range above the first glass transition temperature, the first glass transition temperature being within an operating temperature range of the electronic device, and the first linear expansion coefficient being larger than the second linear expansion coefficient.

11. The acoustic wave device of claim 2 wherein the first linear expansion coefficient is larger than a linear expansion coefficient of the piezoelectric substrate in the propagation direction of the surface acoustic wave.

12. The acoustic wave device of claim 3 wherein the second linear expansion coefficient is smaller than a linear expansion coefficient of the piezoelectric substrate in a direction parallel to a plane defined by the surface of the piezoelectric substrate and perpendicular to the propagation direction of the surface acoustic wave.

13. The acoustic wave device of claim 5 wherein the third linear expansion coefficient is smaller than a linear expansion coefficient of the piezoelectric substrate in the propagation direction of the surface acoustic wave.

14. The acoustic wave device of claim 8 wherein the linear expansion coefficient of the piezoelectric substrate is in a propagation direction of the surface acoustic wave.

15. The acoustic wave device of claim 1 wherein the sealing body defines a space above the comb-shaped electrodes.

16. The acoustic wave device of claim 15 further comprising a cover disposed between the comb-shaped electrodes and the sealing body.

17. The acoustic wave device of claim 1 wherein the sealing body includes a thermosetting resin containing an inorganic filler.

18. The acoustic wave device of claim 1 wherein the first glass transition temperature is within an operating temperature range of the acoustic wave device.

19. The acoustic wave device of claim 4 wherein the sealing body includes different types of epoxy resin each having glass transition temperatures that differ from one another.

20. The acoustic wave device of claim 18 wherein the first glass transition temperature is 50° C. or less.

* * * * *